United States Patent [19]

Tamori, deceased et al.

[11] Patent Number: 4,476,539
[45] Date of Patent: Oct. 9, 1984

[54] TRANSVERSAL TYPE SMEAR-DESMEAR FILTER

[75] Inventors: Michitoshi Tamori, deceased, late of Tokyo, Japan, by Yumi Tamori, administrator; Hideo Kobayashi, Kawasaki, Japan; Kazuo Hashimoto, Ichigayatamachi, Japan; Kazuo Kawai, Yokohama, Japan

[73] Assignee: Kokusai Denshin Denwa Co., Ltd., Tokyo, Japan

[21] Appl. No.: 361,625

[22] Filed: Mar. 25, 1982

[30] Foreign Application Priority Data

Jul. 7, 1981 [JP] Japan ............................. 56-104970

[51] Int. Cl.³ .............................................. G06G 7/02
[52] U.S. Cl. ..................................................... 364/825
[58] Field of Search ................ 364/724, 825; 333/165

[56] References Cited

U.S. PATENT DOCUMENTS

| | | | |
|---|---|---|---|
| 4,120,035 | 10/1978 | Coses et al. | 364/825 |
| 4,143,285 | 3/1979 | White | 328/167 |
| 4,156,914 | 5/1979 | Westell | 364/825 |
| 4,285,045 | 8/1981 | Tamori et al. | 364/724 |

Primary Examiner—Joseph F. Ruggiero
Assistant Examiner—John R. Lastova
Attorney, Agent, or Firm—Armstrong, Nikaido, Marmelstein & Kubovcik

[57] ABSTRACT

A smear-desmear filter having the frequency depending group delay characteristics is implemented by a transversal filter having a plurality of delay elements each having the delay time $1/(2f_2)$, where $f_2$ is the highest frequency component of an input signal, tap weight coefficient means for providing the product of the output of the tap and the predetermined coefficient which is supplied from a digital memory, and an adder for summing up all the outputs of the tap weight coefficient means. A tap and/or a tap weight coefficient means is provided for every m number of delay elements, where m is an integer larger than 2, thus, the number of tap weight coefficient means is merely 1/m of the number of the delay elements. The tap weight stored in said the digital memory is determined by the position (n) of a tap, a delay time ($\tau$) of each delay element, the required delay expansion width (a), and the value of said integer (m). The obtained delay characteristics is sinusoidal in the given frequency band.

2 Claims, 6 Drawing Figures

TRANSVERSAL TYPE SMEAR-DESMEAR FILTER

BACKGROUND OF THE INVENTION

The present invention relates to a transversal type smear-desmear filter for removing an intermittent noise and/or interruption caused by an impulse noise in a data transmission.

A smear-desmear filter is composed of a smear filter and a de-smear filter which have an opposite group delay characteristics with each other. When a smear filter is used in a transmit side, and a de-smear filter is used in a receive side, an intermittent noise energy is dispersed on a time axis, and then, the influence of that noise is removed without influence to a signal to be transmitted.

The effect of a smear-desmear filter to a transmission quality is described in the article by Richard A. Wainwright in IRE Trans. on COM. SYSTEMS, December, 1961, and the theory of that article is briefly described here.

FIG. 1 is a block diagram of a transmission system which utilizes a smear-desmear filter.

In FIG. 1, the reference numeral 1 is a transmitter, 2 is a smear filter, 3 is a de-smear filter, 4 is a receiver, 5 is an intermittent noise generated in a transmission line 10.

When a data signal at the output of the transmitter 1 has the frequency band width 0-f Hz, and that data signal is applied to the smear filter which has the delay characteristics as shown in FIG. 2(a), the data signal with the time duration t is prolonged to t+L in the smear filter, and that prolonged data signal is sent in the transmission line. That prolonged data signal can be restored to the original data signal by passing it through the de-smear filter 3 installed in a receive side having the opposite delay characteristics as shown in FIG. 2(b).

On the other hand, an impulse noise 5 superposed on a data signal in a transmission line passes only the de-smear filter 3, but does not pass the smear filter 2. Accordingly, a noise power is dispersed to the time duration L, and then, the influence of an impulse to a data signal becomes small. A smear-desmear filter having the linear characteristics of FIGS. 2(a) and 2(b) is described in the U.S. Pat. No. 4,285,045.

However, when a smear-desmear filter with the linear delay characteristics of FIGS. 2(a) and 2(b) is implemented by a transversal filter, which has a plurality of series connected delay line with weighted taps, and an adder for providing the sum of the outputs of the taps, the necessary number of the weighted taps increases rapidly with the increase of the necessary delay time. For instance, when a signal with the highest frequency 3.4 kHz is sampled by a sampling frequency of 6.8 kHz and the delay time of 10 msec is requested, the requested number of the weighted taps in the transversal filter is even 85. Further, when the necessary delay time is 34 msec, the number of the weighted taps in the transversal filter is even 259.

When the digital type transversal filter is used, each weighted tap causes a quantize noise since each tap provides a product of the level of a data signal and the tap weight. Therefore, it is preferable that the number of the weighted taps is as few as possible.

SUMMARY OF THE INVENTION

Accordingly, the object of the present invention is to provide a smear-desmear filter implemented by a transversal filter which has less number of weighted taps. The present invention has the sinusoidal delay characteristics, instead of a prior linear delay characteristics for decreasing the number of weighted taps.

According to the present invention, a transversal smear-desmear filter has an input terminal for receiving an input signal, a plurality of series connected delay elements each having the delay time $1/2f_2$ where $f_2$ is the highest frequency component of an input signal, an extreme end of said delay elements being coupled with said input terminal, a plurality of tap weight coefficient means each coupled with junction between delay elements for providing a product of the tap weight coefficient and the output of the related tap, an adder for summing up all the outputs of said tap weight coefficient means, an output terminal coupled with the output of said adder to provide the output of the filter, the duration of said taps being $m/(2f_2)$, where m is an integer larger than 2, a digital memory storing the tap weight coefficient which is a multiplier for said tap weight coefficient means, said multiplier being determined according to a position (n) of a tap, a delay time ($\tau$) of each delay element, required delay expansion width (a) and said integer (m).

The group delay characteristics of the present filter is sinusoidal, and that sinusoidal characteristics reduces the number of weighted taps considerably as compared with that of a linear group characteristics.

Preferably, a smear filter and a desmear filter are supplied the tap coefficients by a common single digital memory.

BRIEF DESCRIPTION OF THE DRAWINGS

The foregoing and other objects, features, and attendant advantages of the present invention will be appreciated as the same become better understood by means of the following description and accompanying drawings wherein.

DESCRIPTION OF THE PREFERRED EMBODIMENT

Figure 1:
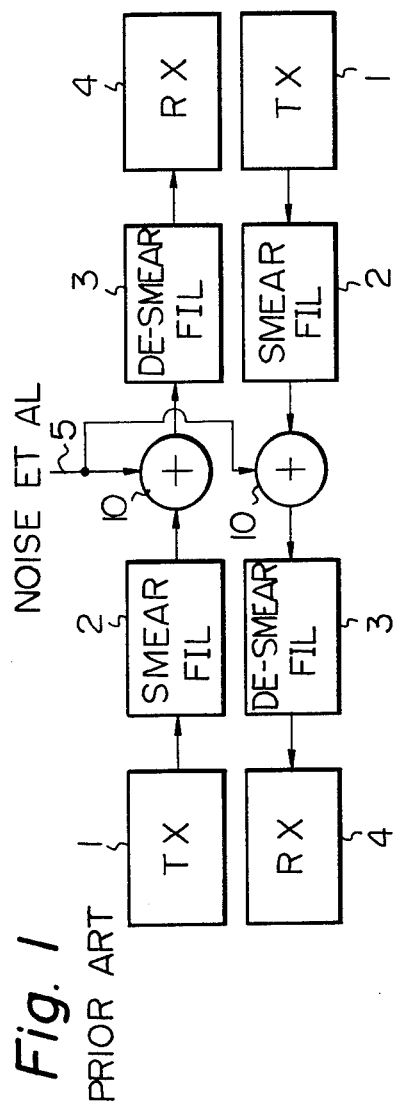
FIG. 1 is a block diagram of a transmission system utilizing the present filter.
Figure 2:
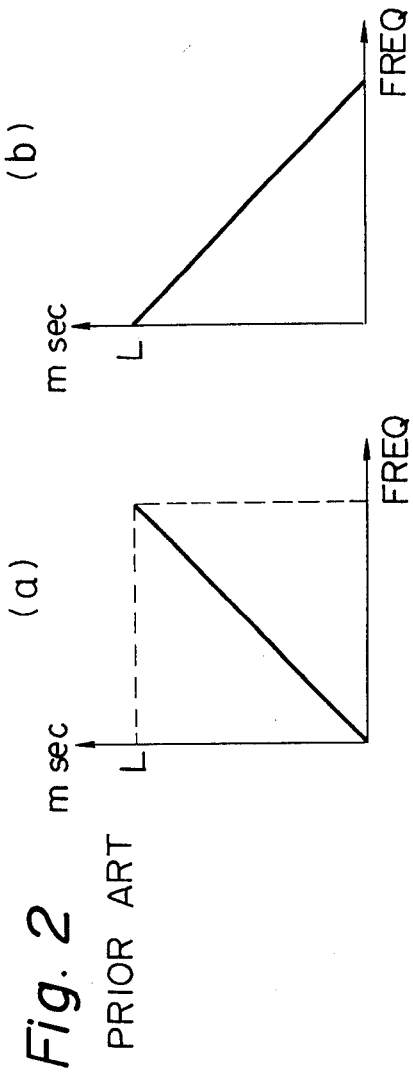
FIG. 2(a) and FIG. 2(b) show characteristics of a prior smear filter and a prior de-smear filter.
Figure 3:
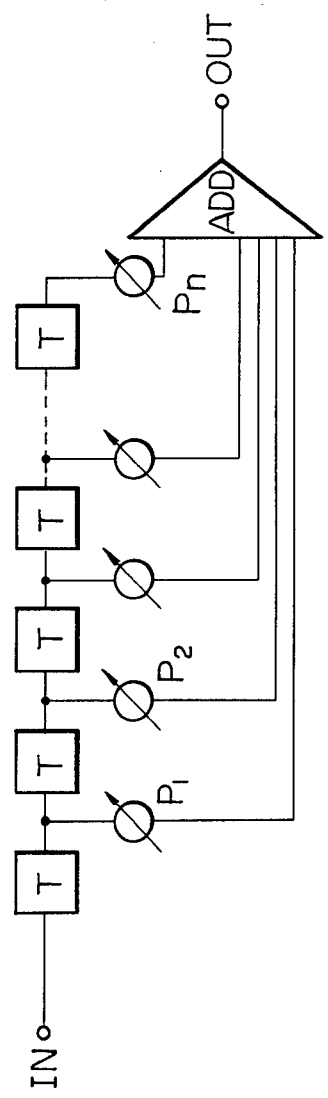
FIG. 3 is a block diagram of a prior transversal filter.

FIG. 3 shows a block diagram of a conventional transversal filter, in which the symbol IN is an input terminal for receiving an input signal, T is a delay element having the delay time equal to a sampling duration, $P_1$ through $P_n$ are multipliers or tap weight coefficient means for providing a tap weight, ADD is an adder for providing the sum of the outputs of the multipliers $P_1$ through $P_n$, and OUT is the output terminal for providing the transversal filter.

The delay time ($\tau$) of each delay element T is determined to be $1/(2f_2)$, when the highest frequency component of an input signal is $f_2$, according to the sampling theory that the sampling frequency is twice as high as the highest frequency of an input signal. Conventionally, the inverse of the sampling frequency coincides with the delay time ($\tau$). In the present invention, that delay time of a delay element between two adjacent taps may be m times ($=m/(2f_2)$) (m is an integer) of the value $1/(2f_2)$.

When a sinusoidal phase characteristic is implemented by a transversal filter with taps for every m number of delay elements, the transfer function of that transversal filter is shown below.

$$F(j\omega) = \exp\left(-j\frac{a}{\tau m}\sin(m\omega\tau)\right) \quad (1)$$

The equation (1) is changed as follows.

$$\exp\left(-j\frac{a}{\tau m}\sin(m\omega\tau)\right) = \quad (2)$$

$$\sum_{n=1}^{\infty} J_n\left(\frac{a}{\tau m}\right)(-1)^n \exp(-jnm\omega\tau) +$$

$$J_0\left(\frac{a}{\tau m}\right) + \sum_{n=1}^{\infty} J_n\left(\frac{a}{\tau m}\right)\exp(jnm\omega\tau)$$

where $J_n(x)$ is a Bessel function train, and (a) is a delay expansion width.

The equation (2) shows that when the tap weight of a tap provided for every m number of delay elements is $J_n(a/(\tau m))(-1)^n$ or $J_n(a/(\tau m))$, a transversal smear filter with the phase characteristics $-(a/(\tau m))\sin(m\omega\tau)$, and the group delay characteristics $-a\cos(m\omega\tau)$ is obtained. As apparent from the equation (2), the variable (x) of the Bessel function $J_n(x)$ for providing the amplitude (a) is divided by (m), the value (n) for the convergence of the Bessel function $J_n(x)$ may be small, and then, that fact means that the number of the necessary taps for a transversal filter may be small.

In case of a de-smear filter, the equation (3) is obtained by changing the sign of the phase characteristics of the equation (1).

$$\exp\left(j\frac{a}{\tau m}\right)\sin(m\omega\tau) = \quad (3)$$

$$\sum_{n=1}^{\infty} J_n\left(\frac{a}{\tau m}\right)\exp(-jnm\omega\tau) +$$

$$J_0\left(\frac{a}{\tau m}\right) + \sum_{n=1}^{\infty} J_n\left(\frac{a}{\tau m}\right)(-1)^n \exp(jnm\omega\tau)$$

The tap weight shown in the equation (3) is the same as that of the equation (2), except that the sequence of the tap weight of the equation (3) is opposite to the sequence of the tap weight of the equation (2). Therefore, when the value of the set of the tap weight of the equation (2) is stored in a digital memory that value is available for the tap weight of the equation (3), also.

Figure 4:
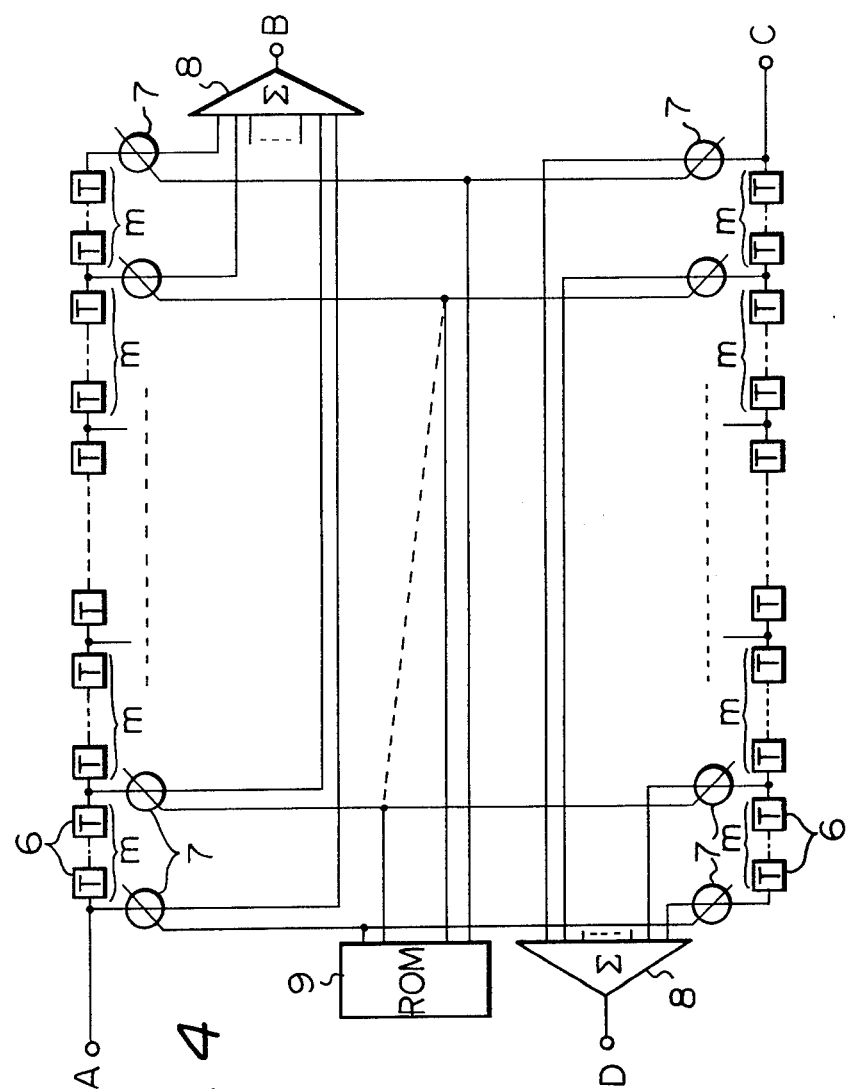
FIG. 4 is a block diagram of the present transversal filter.

FIG. 4 is a block diagram of the present smear-desmear filter utilizing a transversal filter according to the present invention. In the figure, the symbol A is an input terminal of a smear filter in a transmit side, B is an output terminal of a smear filter, C is an input terminal of a de-smear filter in a receive side, D is an output terminal of a de-smear filter, 6 is a delay element of a transversal filter. That delay element is implemented for instance by a shift register. The reference numeral 7 is a tap weight coefficient means for providing a product of a tap weight multiplier and the output of the related tap, and that tap weight coefficient means 7 is provided for every m number of delay elements. The reference numeral 8 is an adder, 9 is a digital memory storing the set of tap weight coefficient values obtained through the calculation of the Bessel function value.

A data signal from a transmitter is applied to an input terminal A of a smear filter, and that data signal is transferred in a series of delay elements. In the delay elements, a data signal is output at the taps for every m number of delay elements, and each output of the tap is multiplied with the content of the digital memory by the multiplier or the tap weight coefficient means 7. All the outputs of the tap weight coefficient means 7 of all the taps are summed up in the adder 8, which provides the output signal to the output terminal B.

The operation of a de-smear filter is similar to that of a smear filter, except that the sequence of the content of the digital memory is opposite to that of a smear filter.

Figure 5:
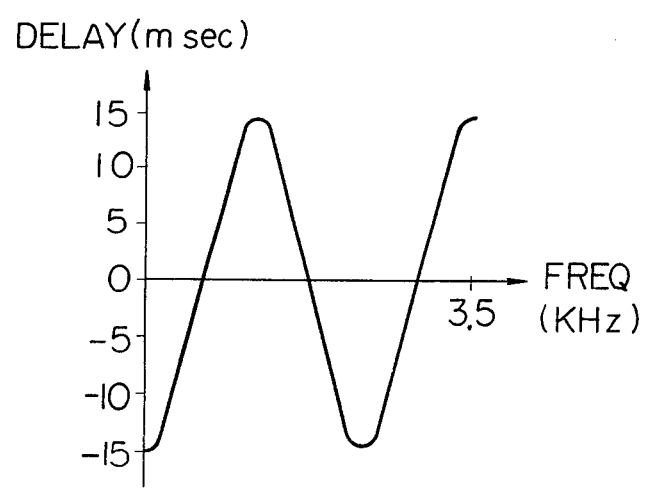
FIG. 5 shows an example of a group delay characteristics of a smear filter according to the present invention.

FIG. 5 shows the example of the group delay characteristics of a smear filter according to the present invention, in which the number (m) is 3, and the number of the weighted taps is 85. As apparent from FIG. 5, the value $a=15$ msec is obtained, and that value (a) provides 30 msec of the group delay expansion width. Since a prior transversal type smear filter must have 259 weighted taps for providing 34 msec of group delay expansion width, the number of the necessary weighted taps in the present invention is decreased to $1/m = \frac{1}{3}$.

As described above, the present invention provides the sinusoidal group delay characteristics for a smear filter and a de-smear filter, instead of a linear group delay characteristics of a prior art. Because of that sinusoidal characteristics, the delay expansion width is improved without increasing the number of the weighted taps. Thus, an improved smear filter and an improved de-smear filter are obtained, and an improved transmission quality is obtained in a communication system.

From the foregoing it will now be apparent that a new and improved smear-desmear filter has been found. It should be understood of course that the embodiment disclosed is merely illustrative and is not intended to limit the scope of the invention. Reference should be made to the appended claims, therefore, rather than the specification as indicating the scope of the invention.

What is claimed is:

1. A transversal type smear-desmear filter comprising an input terminal for receiving an input signal, a plurality of series connected delay elements each having the delay time $1/(2f_2)$ where $f_2$ is the highest frequency component of an input signal, the first of said series of plurality of delay elements being coupled to said input terminal, a plurality of tap weight coefficient means each coupled to a junction between adjacent delay elements of said series of delay elements, means for multiplying the input to said tap weight coefficient means by a predetermined number, an adder for providing the sum of all the outputs of said tap weight coefficient means, and an output terminal coupled with the output of said adder to provide the output of the filter, characterized in that (a) the duration of the delay of said taps is $m/(2f_2)$, where m is an integer larger than 2, and $1/(2f_2)$ is delay time of each delay element, (b) a tap weight which is a multiplier of said tap weight coefficient means is provided by a digital memory which stores values defined by Bessel function value according to a position (n) of a tap, a delay time (τ) of each delay element, delay expansion width (a) and said integer (m), (c) the delay characteristics of said transversal filter is sinusoidal, and (d) the transfer function of the filter as a smear filter is $$\exp\left(-j\frac{a}{\tau m}\sin(m\omega\tau)\right) = \sum_{n=1}^{\infty} J_n\left(\frac{a}{\tau m}\right)(-1)^n\exp(-jnm\omega\tau)$$

$$+ J_0\left(\frac{a}{\tau m}\right)$$

$$+ \sum_{n=1}^{\infty} J_n\left(\frac{a}{\tau m}\right)\exp(jnm\omega\tau)$$

, and (e) the transfer function of the filter as a desmear filter is $$\exp\left(j\frac{a}{\tau m}\sin(m\omega\tau)\right) = \sum_{n=1}^{\infty} J_n\left(\frac{a}{\tau m}\right)\exp(-jnm\omega\tau)$$

$$+ J_0\left(\frac{a}{\tau m}\right)$$

$$+ \sum_{n=1}^{\infty} J_n\left(\frac{a}{\tau m}\right)(-1)^n\exp(jnm\omega\tau)$$

2. A transversal type smear-desmear filter according to claim 1, wherein a smear filter is provided in a transmit side, a de-smear filter is provided in a receive side, and a common single digital memory is provided for both said smear filter and said de-smear filter for providing the tap weight to said tap weight coefficient means so that the sequence of the tap weights of the smear filter is opposite to that of the de-smear filter.

* * * * *